(12) United States Patent
Tripathi et al.

(10) Patent No.: US 7,391,829 B2
(45) Date of Patent: Jun. 24, 2008

(54) APPARATUS, SYSTEM AND METHOD FOR RECEIVER EQUALIZATION

(75) Inventors: Alok Tripathi, Beaverton, OR (US); Ken Drottar, Portland, OR (US); Dave Dunning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 810 days.

(21) Appl. No.: 10/612,864

(22) Filed: Jul. 2, 2003

(65) Prior Publication Data

US 2005/0002479 A1    Jan. 6, 2005

(51) Int. Cl.
*H04L 7/00* (2006.01)
(52) U.S. Cl. .................... 375/345; 330/254; 330/278; 330/299
(58) Field of Classification Search ............... 375/345, 375/229–236; 330/254, 278, 299
See application file for complete search history.

(56) References Cited

U.S. PATENT DOCUMENTS

| | | | | |
|---|---|---|---|---|
| 3,671,886 A | * | 6/1972 | Fudemoto et al. | 333/18 |
| 3,906,406 A | * | 9/1975 | Iwakami | 333/18 |
| 4,837,527 A | * | 6/1989 | Sauer | 341/143 |
| 4,839,542 A | * | 6/1989 | Robinson | 327/558 |
| 5,191,300 A | * | 3/1993 | Graham et al. | 330/310 |
| 5,486,791 A | * | 1/1996 | Spitalny et al. | 330/282 |
| 5,955,911 A | * | 9/1999 | Drost et al. | 327/404 |
| 6,226,322 B1 | | 5/2001 | Mukherjee | |
| 6,542,540 B1 | | 4/2003 | Leung et al. | |
| 2003/0128767 A1 | * | 7/2003 | Kudoh | 375/257 |

OTHER PUBLICATIONS

International Search Report and Written Opinion from PCT/US2004/021331, International Filing Date Jun. 30, 2004.

* cited by examiner

*Primary Examiner*—Curtis Odom
(74) *Attorney, Agent, or Firm*—Robert D. Anderson (57) ABSTRACT

In some embodiments, a frequency dependent gain circuit is coupled to an output of an amplifier. The gain circuit provides at least two ranges of frequency dependent gain characteristics in response to the output of the amplifier. A control circuit provides one of the at feast two gain values as an output. Other embodiments are described and claimed.

20 Claims, 8 Drawing Sheets

APPARATUS, SYSTEM AND METHOD FOR RECEIVER EQUALIZATION

RELATED APPLICATION

This application is related to an application entitled "APPARATUS, AMPLIFIER, SYSTEM AND METHOD FOR RECEIVER EQUALIZATION", inventor Ken DROTTAR, filed on Jun. 27, 2003.

TECHNICAL FIELD

The inventions generally relate to receiver equalization.

BACKGROUND

Point-to-point interconnects between two ICs (Integrated Circuits) or ASICs (Application Specific Integrated Circuits) are becoming a widely accepted bus technology for high speed data transfer applications. The signaling scheme for such links can be single-ended or differential. Inter-symbol interference (ISI) due to the interconnect frequency dependent insertion loss characteristics becomes an even larger problem with current printed circuit board (PCB) technology. ISI is one of the primary bottlenecks in implementation of point-to-point high speed interconnection technology.

Various on-die receiver equalization techniques can be used to reduce the inter-symbol interference (ISI) generated by the frequency dependent loss characteristics of PCB traces. Some known receiver equalization techniques include equalization schemes with a digital filter and equalization schemes with an active linear filter.

Receiver equalization techniques using a digital filter use an appropriate active digital FIR filter (finite impulse response filter) or an IIR filter (infinite impulse response filter) at the receiver end to cancel out the frequency dependent loss characteristics. One example of such a digital filter is an adaptive-tapped-delay-line-filter implemented at the receiver end. Digital filter receiver equalization techniques at the receiver end are advantageous, but difficult to implement in silicon. Digital filter receiver equalization circuits using FIR or IIR filters dissipate a lot of power. The coefficient of such a digital adaptive filter can be determined using a suitable training sequence and a high order filter scheme is possible, but implementation is extremely complex. It is difficult to obtain gain during implementation of this stage due to limited available voltage headroom.

Equalization schemes with an active linear filter is easy to implement and circuits using these schemes are able to dissipate power appropriately. Additionally, interconnects with a large loss can be equalized. This can lead to use of longer length interconnects. However, active filters are typically implemented using gm-c circuit elements, which have limited bandwidth.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to receiver equalization. In some embodiments adaptive equalization is implemented at a receiver. In some embodiments adaptive equalization is performed for signals transmitted over point-to-point intereconnects (for example, between chips), high speed data buses, or any other high speed serial interconnect.

In some embodiments, a frequency dependent gain circuit is coupled to an output of an amplifier. The gain circuit provides at least two ranges of frequency dependent gain characteristics in response to the output of the amplifier. A control circuit provides one of the at least two gain values as an output.

In some embodiments a CMOS (Complementary Metal Oxide Semiconductor) adaptive equalization circuit is used that is based on an RC filter in order to reduce inter-symbol interference (ISI). In some embodiments the equalization circuit and/or the RC filter are realized using an on-die passive resistance and capacitance elements. In some embodiments adaptive feedback is based on 8B/10B encoded signal characteristics of DC balance (for example, in order to track temperature and process variations). In some embodiments it is possible for a generic high speed receiver to be optimized for given interconnects using digital control elements. In some embodiments a resistance R is realized using passive components (for example, poly resistance, gbn-well, and/or diffused), or with active components (for example, using a pass gate, an n-well pass gate, etc.). In some embodiments a capacitance C is realized using metal-to-metal capacitance, with a pMOS gate to source/drain capacitance or with nMOS gate to source/drain capacitance when nMOS isolated well is available.

In some embodiments resistance and capacitance values are dependent on insertion loss characteristics of the interconnect and the termination resistance. In some embodiments adaptive equalization is performed to adjust the equalization based on desired interconnect insertion loss characteristics. In order to obtain variable discrete frequency dependent gain, two or more equalization circuits may be cascaded (or attached in series) in some embodiments, where the outputs of the equalization circuits are fed in a multiplexed fashion. In some embodiments discrete gain values are provided. In some embodiments one of a group of two or more discrete gain values are selected as an output value. In some embodiments the selection is performed using DC balance techniques. In some embodiments the selection is performed using 8B/10B encoded signal characteristics of DC balance.

Figure 1:
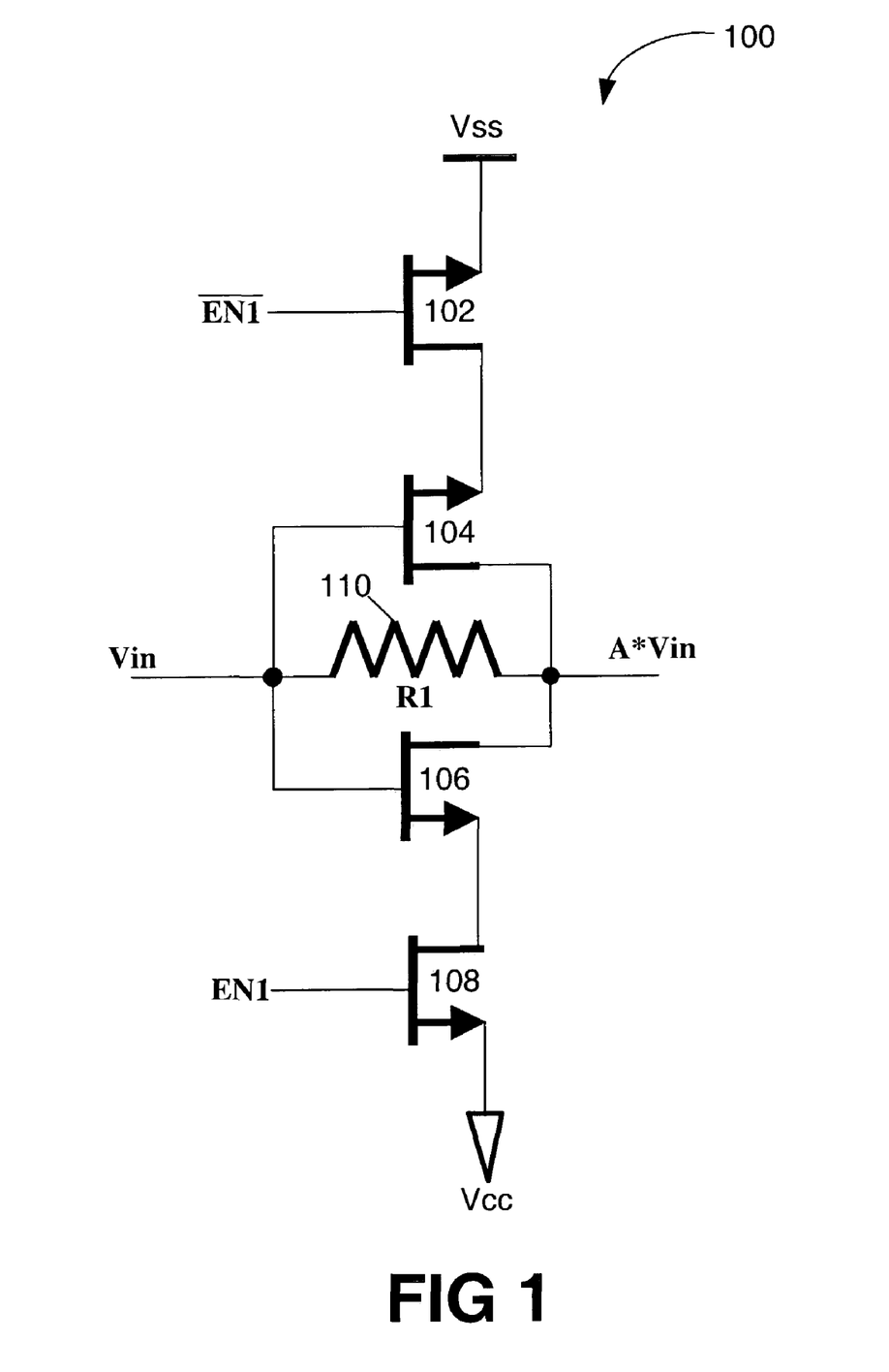
FIG. 1 is a circuit representation of an apparatus according to some embodiments of the inventions.

FIG. 1 illustrates an apparatus 100 according to some embodiments. Apparatus 100 includes an input Vin, an inverse input $\overline{EN1}$, an input EN1, an output A*Vin, a p-channel MOSFET 102 (Metal Oxide Semiconductor Field Effect Transistor) (pMOS transistor 102), a pMOS transistor 104, an n-channel MOSFET 106 (nMOS transistor 106), an nMOS transistor 108 and a resistor 110. In some embodiments apparatus 100 is a CMOS amplifier. In some embodiments apparatus 100 is a high bandwidth low gain CMOS amplifier. In some embodiments apparatus 100 is an equalizer circuit or is a building block for an equalizer circuit.

A source of pMOS transistor 102 is coupled to a high voltage source Vss. A gate of pMOS transistor 102 is coupled to the inverse input $\overline{EN1}$. A drain of pMOS transistor 102 is coupled to a source of pMOS transistor 104.

A source of pMOS transistor 104 is coupled to the drain of pMOS transistor 102. A gate of pMOS transistor 104 is coupled to the input Vin, to a first terminal of resistor 110, and to a gate of nMOS transistor 106. A drain of pMOS transistor 104 is coupled to a second terminal of resistor 110, to the output A*Vin, and to a drain of nMOS transistor 106.

A source of nMOS transistor 106 is coupled to a drain of nMOS transistor 108. A gate of nMOS transistor 106 is coupled to the input Vin, to the first terminal of resistor 110, and to the gate of pMOS transistor 104. A drain of nMOS transistor 106 is coupled to the drain of pMOS transistor 104, to the second terminal of resistor 110 and to the output A*Vin.

A source of nMOS transistor 108 is coupled to a low level voltage source Vcc. In some embodiments the low level voltage source Vcc is a ground voltage. A gate of nMOS transistor 108 is coupled to the input EN1. A drain of nMOS transistor 108 is coupled to the source of nMOS transistor 106.

Resistor 110 has a resistance R1. A first terminal of resistor 110 is coupled to the input Vin, the gate of pMOS transistor 104 and the gate of nMOS transistor 106. A second terminal of resistor 110 is coupled to the output A*Vin, the drain of pMOS transistor 104 and the drain of nMOS transistor 106. Resistor 110 is coupled between the input and the output of apparatus 100, which is in some embodiments a modified CMOS amplifier. Resistance R1 of resistor 110 provides negative feedback to the CMOS amplifier 100 and therefore increases the bandwidth of the amplifier, and the circuit becomes self biased. An output impedance of amplifier 100 is approximately equal to the resistance R1 of resistor 110. An input impedance of amplifier 100 is approximately equal to R1/(1+A), where R1 is the resistance of resistor 100 and A is the gain of the amplifier 100. The voltage gain of amplifier 100 is equal to −A, where A is the gain of the amplfier.

Figure 2:
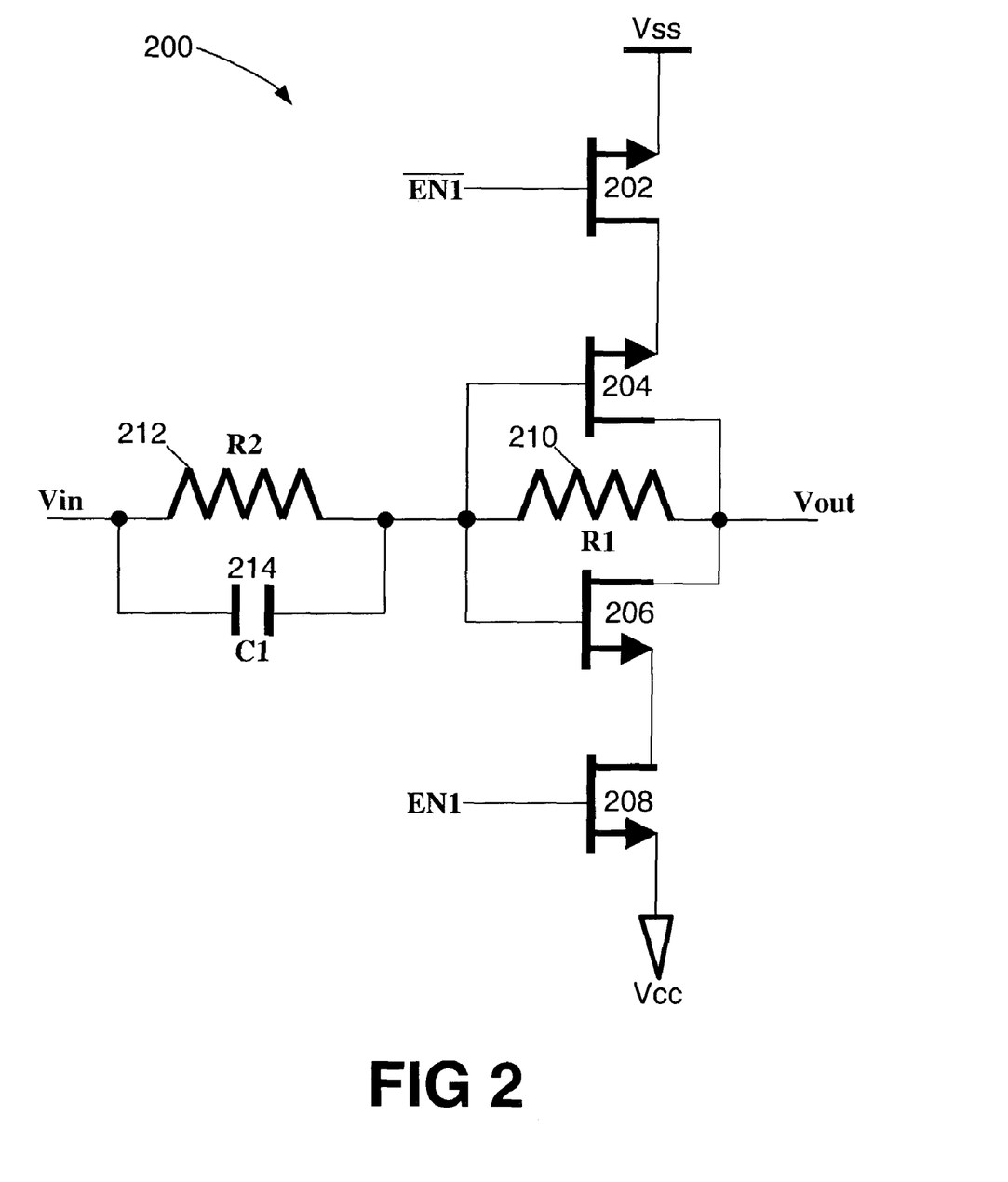
FIG. 2 is a circuit representation of an apparatus according to some embodiments of the inventions.

FIG. 2 illustrates an apparatus 200 according to some embodiments. In some embodiments apparatus 200 is an equalization circuit. Apparatus 200 includes an input Vin, an inverse input $\overline{EN1}$, an input EN1, an output Vout, a pMOS transistor 202, a pMOS transistor 204, an nMOS transistor 206, an nMOS transistor 208, a resistor 210, a resistor 212 and a capacitor 214. Transistors 202, 204, 206 and 208 and resistor 210 are similar to transistors 102, 104, 106 and 108 and resistor 110 illustrated in and described in reference to FIG. 1, and may be exactly the same as the elements in FIG. 1.

A source of pMOS transistor 202 is coupled to a high voltage source Vss. A gate of pMOS transistor 202 is coupled to the inverse input $\overline{EN1}$. A drain of pMOS transistor 202 is coupled to a source of pMOS transistor 204.

A source of pMOS transistor 204 is coupled to the drain of pMOS transistor 202. A gate of pMOS transistor 204 is coupled to a first terminal of resistor 210, to a gate of nMOS transistor 206, to a second terminal of resistor 212, and to a second terminal of capacitor 214. A drain of pMOS transistor 204 is coupled to a second terminal of resistor 210, to the output Vout, and to a drain of nMOS transistor 206.

A source of nMOS transistor 206 is coupled to a drain of nMOS transistor 208. A gate of nMOS transistor 206 is coupled to the first terminal of resistor 210, to the gate of pMOS transistor 204, to the second terminal of resistor 212 and to the second terminal of capacitor 214. A drain of nMOS transistor 206 is coupled to the drain of pMOS transistor 204, to the second terminal of resistor 210 and to the output Vout.

A source of nMOS transistor 208 is coupled to a low level voltage source Vcc. In some embodiments the low level voltage source Vcc is a ground voltage. A gate of nMOS transistor 208 is coupled to the input EN1. A drain of nMOS transistor 208 is coupled to the source of nMOS transistor 206.

Resistor 210 has a resistance R1. This resistance R1 of resistor 210 may be the same as or different than the resistance R1 of resistor 110 illustrated in FIG. 1. A first terminal of resistor 210 is coupled to a second terminal of resistor 212, to a second terminal of capacitor 214, to the gate of pMOS transistor 204 and to the gate of nMOS transistor 206. A second terminal of resistor 210 is coupled to the output Vout, to the drain of pMOS transistor 204 and to the drain of nMOS transistor 206.

Resistor 212 has a resistance R2 that may be the same resistance as or a different resistance than resistance R1 of resistor 210. Further, as mentioned above, the resistance R1 of resistor 210 need not be the same value as the resistance R1 of resistor 110 of FIG. 1. A first terminal of resistor 212 is coupled to the input Vin and to a first terminal of capacitor 214. A second terminal of resistor 212 is coupled to a second terminal of capacitor 214, a terminal of resistor 210, a gate of pMOS transistor 204 and a gate of nMOS transistor 206.

Capacitor 214 has a capacitance C1 that may be any value. A first terminal of capacitor 214 is coupled to the input Vin and to a first terminal of resistor 212. A second terminal of capacitor 214 is coupled to a second terminal of resistor 212, a terminal of resistor 210, a gate of pMOS transistor 204 and a gate of nMOS transistor 206.

In some embodiments the resistor 212 and capacitor 214 are an on die R2 and C1 resistive network. In some embodiments apparatus 200 may be referred to as an equalization circuit with an on die resistive network (including resistor 212 and capacitor 214) followed by a modified CMOS amplifier (including transistors 202, 204, 206 and 208 and resistor 210). In some embodiments the value of R1, R2 and C1 may be set or fixed to provide a predetermined level of quantified equalization.

Figure 3:
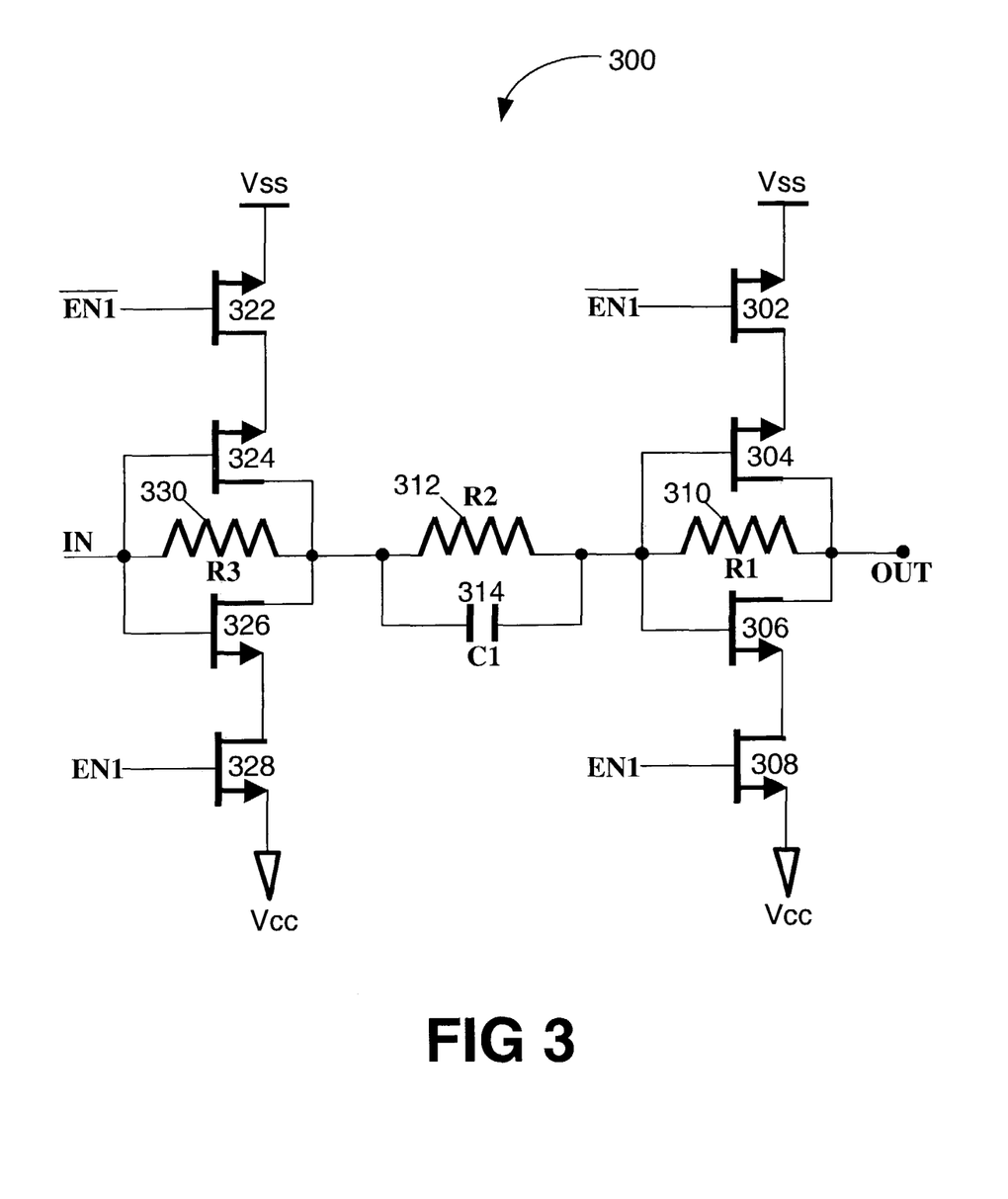
FIG. 3 is a circuit representation of an apparatus according to some embodiments of the inventions.

FIG. 3 illustrates an apparatus 300 according to some embodiments. In some embodiments FIG. 3 is an equalization circuit. In some embodiments apparatus 300 is referred to as an equalization block or a complete equalization block. Apparatus 300 includes an input IN, an inverse input $\overline{EN1}$, an input EN1, an output OUT, a pMOS transistor 302, a pMOS transistor 304, an nMOS transistor 306, an nMOS transistor 308, a resistor 310, a resistor 312, a capacitor 314, a pMOS transistor 322, a pMOS transistor 324, an nMOS transistor 326, an nMOS transistor 328 and a resistor 330. Transistors 302, 304, 306 and 308 and resistor 310 are similar to transistors 102, 104, 106 and 108 and resistor 110 illustrated in and described in reference to FIG. 1 and are similar to transistors 202, 204, 206 and 208 and resistor 210 illustrated in and described in reference to FIG. 2, and may be exactly the same as the elements in FIG. 1 and/or FIG. 2. Similarly resistor 312 and capacitor 314 are similar to resistor 212 and capacitor 214 illustrated in and described in reference to FIG. 2, and may be exactly the same as the elements in FIG. 2.

A source of pMOS transistor 302 is coupled to a high voltage source Vss. A gate of pMOS transistor 302 is coupled to the inverse input $\overline{EN1}$. A drain of pMOS transistor 302 is coupled to a source of pMOS transistor 304.

A source of pMOS transistor 304 is coupled to the drain of pMOS transistor 302. A gate of pMOS transistor 304 is coupled to a first terminal of resistor 310, to a gate of nMOS transistor 306, to a second terminal of resistor 312, and to a second terminal of capacitor 314. A drain of pMOS transistor 304 is coupled to a second terminal of resistor 310, to the output OUT, and to a drain of nMOS transistor 306.

A source of nMOS transistor 306 is coupled to a drain of nMOS transistor 308. A gate of nMOS transistor 306 is coupled to the first terminal of resistor 310, to the gate of pMOS transistor 304, to the second terminal of resistor 312 and to the second terminal of capacitor 314. A drain of nMOS transistor 306 is coupled to the drain of pMOS transistor 304, to the second terminal of resistor 310 and to the output OUT.

A source of nMOS transistor 308 is coupled to a low level voltage source Vcc. In some embodiments the low level voltage source Vcc is a ground voltage. A gate of nMOS transistor 308 is coupled to the input EN1. A drain of nMOS transistor 308 is coupled to the source of nMOS transistor 306.

Resistor 310 has a resistance R1. This resistance R1 of resistor 310 may be the same as or different than either the resistance R1 of resistor 110 illustrated in FIG. 1 or the resistance R1 of resistor 210 illustrated in FIG. 2. A first terminal of resistor 310 is coupled to a second terminal of resistor 312, to a second terminal of capacitor 314, to the gate of pMOS transistor 304 and to the gate of nMOS transistor 306. A second terminal of resistor 310 is coupled to the output OUT, to the drain of pMOS transistor 304 and to the drain of nMOS transistor 306.

Resistor 312 has a resistance R2 which may be the same resistance as or a different resistance than resistance R1 of resistor 310 in FIG. 3, resistance R2 of resistor 212 in FIG. 2, resistance R1 of resistor 210 in FIG. 2, or resistance R1 of resistor 110 in FIG. 1. Further, as mentioned above, the resistance R1 of resistor 310 need not be the same value as the resistance R1 of resistor 110 of FIG. 1 or the resistance R1 of resistor 210 of FIG. 2. A first terminal of resistor 312 is coupled to a drain of pMOS transistor 324, a second terminal of resistor 330, a drain of nMOS transistor 326, and to a first terminal of capacitor 314. A second terminal of resistor 312 is coupled to a second terminal of capacitor 314, to a first terminal of resistor 310, to a gate of pMOS transistor 304 and to a gate of nMOS transistor 306.

Capacitor 314 has a capacitance C1 which may be any value. Capacitance C1 of capacitor 314 may be the same as or different than the capacitance C1 of capacitor 214 of FIG. 2. A first terminal of capacitor 314 is coupled to a drain of pMOS transistor 324, a second terminal of resistor 330, a drain of nMOS transistor 326, and to a first terminal of resistor 312. A second terminal of capacitor 314 is coupled to a second terminal of resistor 312, to the first terminal of resistor 310, to a gate of pMOS transistor 304 and to a gate of nMOS transistor 306.

A source of pMOS transistor 322 is coupled to a high voltage source Vss. A gate of pMOS transistor 322 is coupled to the inverse input $\overline{EN1}$. A drain of pMOS transistor 322 is coupled to a source of pMOS transistor 324.

A source of pMOS transistor 324 is coupled to the drain of pMOS transistor 322. A gate of pMOS transistor 324 is coupled to the input IN, to a first terminal of resistor 330, and to a gate of nMOS transistor 326. A drain of pMOS transistor 324 is coupled to a second terminal of resistor 330, to the first terminal of resistor 312, to the first terminal of capacitor 314, and to a drain of nMOS transistor 326.

A source of nMOS transistor 326 is coupled to a drain of nMOS transistor 328. A gate of nMOS transistor 326 is coupled to the first terminal of resistor 330, to the gate of pMOS transistor 324, and to the input IN. A drain of nMOS transistor 326 is coupled to the drain of pMOS transistor 302, to the first terminal of resistor 312 and to the first terminal of capacitor 314.

A source of nMOS transistor 328 is coupled to a low level voltage source Vcc. In some embodiments the low level voltage source Vcc is a ground voltage. A gate of nMOS transistor 328 is coupled to the input EN1. A drain of nMOS transistor 328 is coupled to the source of nMOS transistor 326.

A first terminal of resistor 330 is coupled to the input IN, to the gate of pMOS transistor 324 and to the gate of nMOS transistor 326. A second terminal of resistor 330 is coupled to the drain of pMOS transistor 324, to the drain of nMOS transistor 326, to the first terminal of resistor 312, and to the first terminal of capacitor 314. Resistor 330 has a resistance R3 which may be the same resistance as or a different resistance than resistance R2 of resistor 312 in FIG. 3, resistance R2 of resistor 212 in FIG. 2, resistance R1 of resistor 310 in FIG. 3, resistance R1 of resistor 210 in FIG. 2, or resistance R1 of resistor 110 in FIG. 1. In some embodiments the resistance R3 of resistor 330 is the same as the resistance R1 of resistor 310 in FIG. 3.

In some embodiments the low frequency response of the equalization circuit 300 is dependent on resistance ratios, and is therefore process independent. In some embodiments the shape of the frequency dependent transfer characteristics of the equalization circuit 300 is a function of the capacitance C1 of capacitor 314 times the resistance R2 of resistor 312 (that is a function of C1*R2). In some embodiments of an equalization circuit such as where the shape of frequency dependent characteristics is a function of C1*R2, the characteristics are process and temperature dependent, and it is beneficial to track them with adaptive feedback. The adaptive feedback can depend on the input signal characteristics.

In some embodiments the resistance and capacitance values such as R2 and C1 are fixed during a design phase such that they are dependent on insertion loss characteristics of the interconnect and the termination resistance. In some embodiments in order to track process variations the resistances R1, R2 and R3 of any of the embodiments illustrated and described herein are formed with the same technology. For example, if resistance R1 of some embodiments of FIG. 3 is poly resistance then R2 and R3 should be of poly resistance. Additionally, the resistances and capacitances (for example, R1, R2, R3 and C1) are fixed during circuit design phase and are not varied during circuit operation.

In some embodiments adaptive equalization is performed to adjust the equalization based on desired interconnect insertion loss characteristics. In order to obtain variable discrete frequency dependent gain, two or more equalization circuits may be cascaded (or attached in series) in some embodiments, where the outputs of the equalization circuits are fed in a multiplexed fashion.

Figure 4:
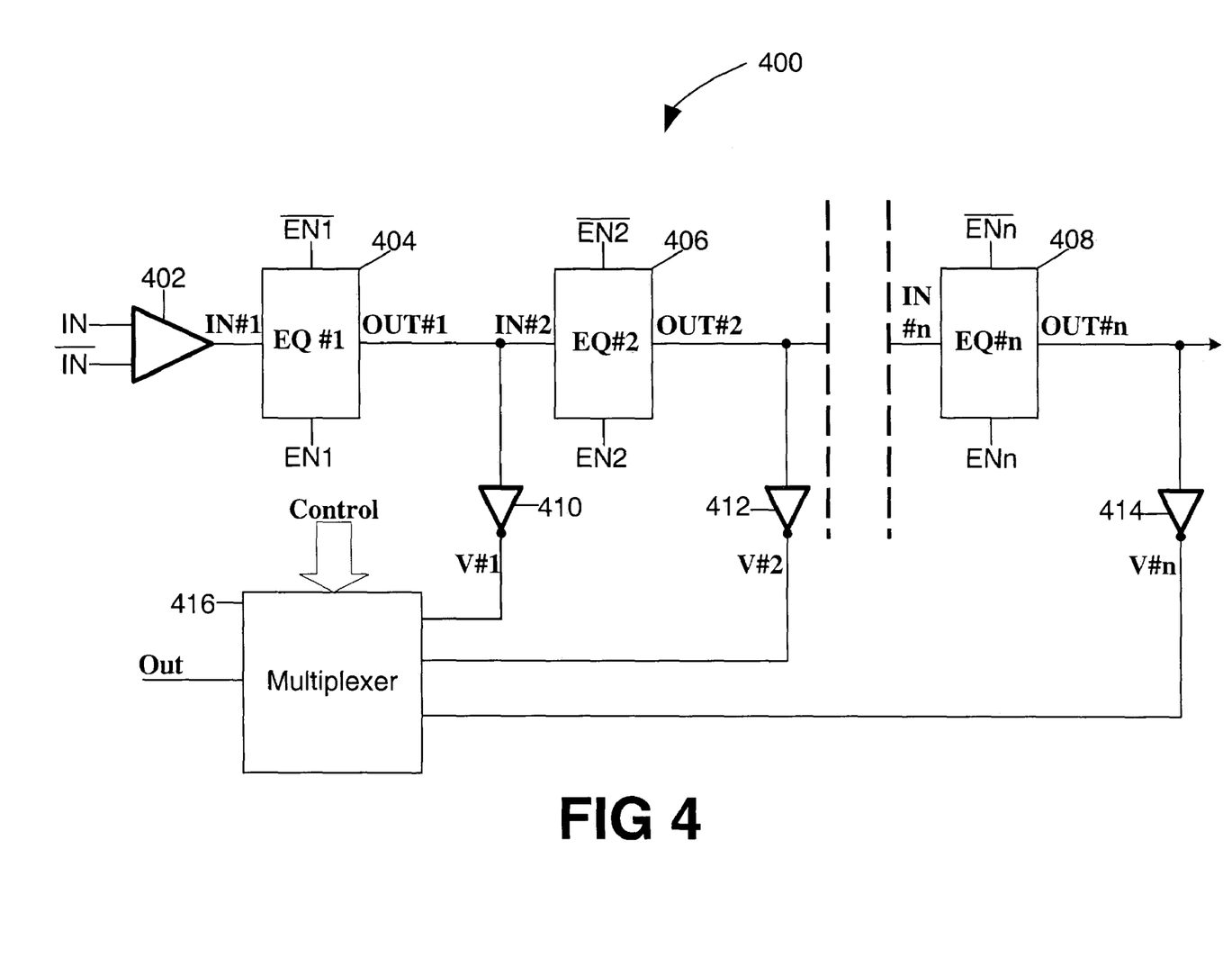
FIG. 4 is a block diagram representation of an apparatus according to some embodiments of the inventions.

FIG. 4 illustrates an apparatus 400 according to some embodiments. In some embodiments apparatus 400 is an equalization circuit providing an output OUT equalization value. Apparatus 400 includes an amplifier 402, two or more equalization circuits 404, 406 and 408, two or more inverters 410, 412 and 414 and a multiplexer 416. In some. embodiments, amplifier 402, two or more equalization circuits 404, 406 and 408 and two or more inverters 410, 412 and 414 may be referred to as a gain circuit that supplies two or more discrete gain values V#1, V#2, . . . , V#n.

Amplifier 402 has two differential inputs IN and $\overline{IN}$ and a single ended output that is provided as an input IN#1 to equalizer circuit 404. In some embodiments amplifier 402 is a CMOS amplifier. In some embodiments amplifier 402 is a high bandwidth low gain CMOS amplifier. In some embodiments amplifier 402 is a wide band differential to single ended amplifier.

Equalization circuits 404, 406 and 408 may be each be any type of equalization circuit. FIG. 4 shows three equalization circuits 404, 406 and 408. However, any number of equalization circuits may be used in different embodiments, as shown by the dotted lines between the output OUT#2 of equalization circuit 406 and the input IN#n of equalization circuit 408. In some embodiments any or all of the two or more equalization circuits (including any specifically not shown in FIG. 4) may be implemented using the equalization circuits illustrated in and described in reference to FIG. 1, FIG. 2 and/or FIG. 3. In some embodiments all of the equalization circuits are exactly the same. In some embodiments the equalization circuits are different from each other. In some embodiments some of the equalization circuits are the same and some are different from each other.

Equalization circuits 404, 406 and 408 are cascaded (coupled in series). Inverters 410, 412 and 414 are respectively coupled to outputs of equalization circuits 404, 406 and 408 to provide discrete gain values V#1, V#2 and V#n, respectively. In some embodiments as illustrated in FIG. 4, in order to obtain variable discrete frequency dependent gain, several equalization circuits are cascaded to provide a discrete set of gain values.

The discrete gain values V#1, V#2, . . . , V#n are fed to inputs of the multiplexer 416. Control logic input to multiplexer 416 is used as a select input to multiplexer 416 to select an appropriate one of the discrete gain values. This selection and control may be based on, for example, required equalizer transfer characteristics, for example. In some embodiments the control logic selects the appropriate number of output stages for the required equalizer transfer characteristics.

In some embodiments equalization circuits 404, 406 and 408 are different by varying resistance and capacitance values in the different circuits. For example, in some embodiments in which each of the equalization circuits 404, 406, . . . , 408 are equalization circuits 300, each of those equalization circuits have different resistance values R2 of resistor 312 and different capacitance values C1 of capacitor 314. In some embodiments different resistance and capacitance values are chosen based on interconnect length.

Figure 5:
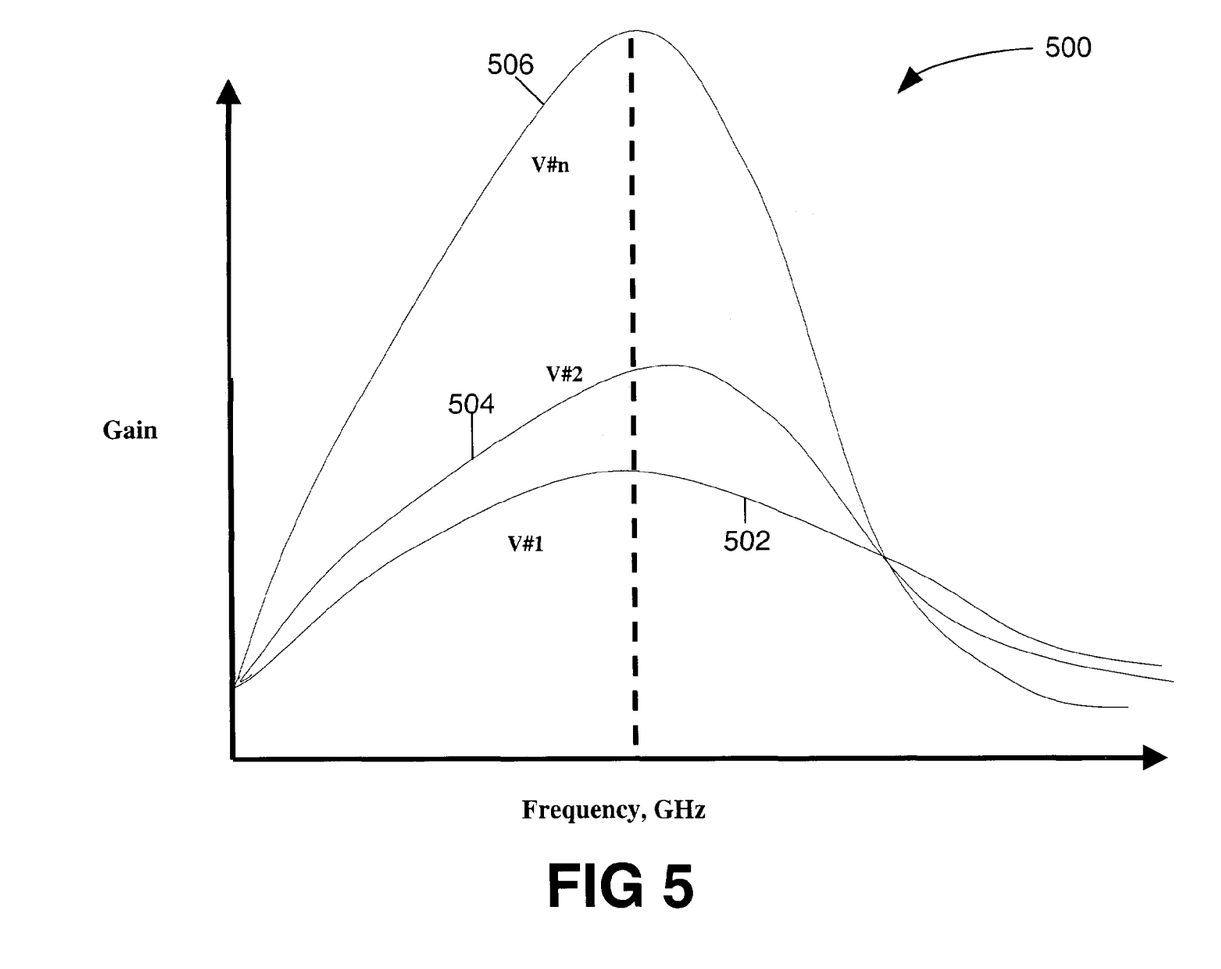
FIG. 5 is a graphical representation according to some embodiments of the inventions.

FIG. 5 is a waveform representation of a frequency response 500. Frequency response 500 may be a frequency response for the discrete gain values V#1, V#2, . . . , V#n provided by apparatus 400 illustrated in FIG. 4, for example. Waveforms 500 include a gain signal 502 (V#1), a gain signal 504 (V#2) and a gain signal 506 (V#n). As evident from FIG. 5, by enabling a number of equalization stages (for example, using the cascaded equalization circuits of FIG. 4) the frequency dependent transfer function can be varied in discrete steps.

Figure 6:
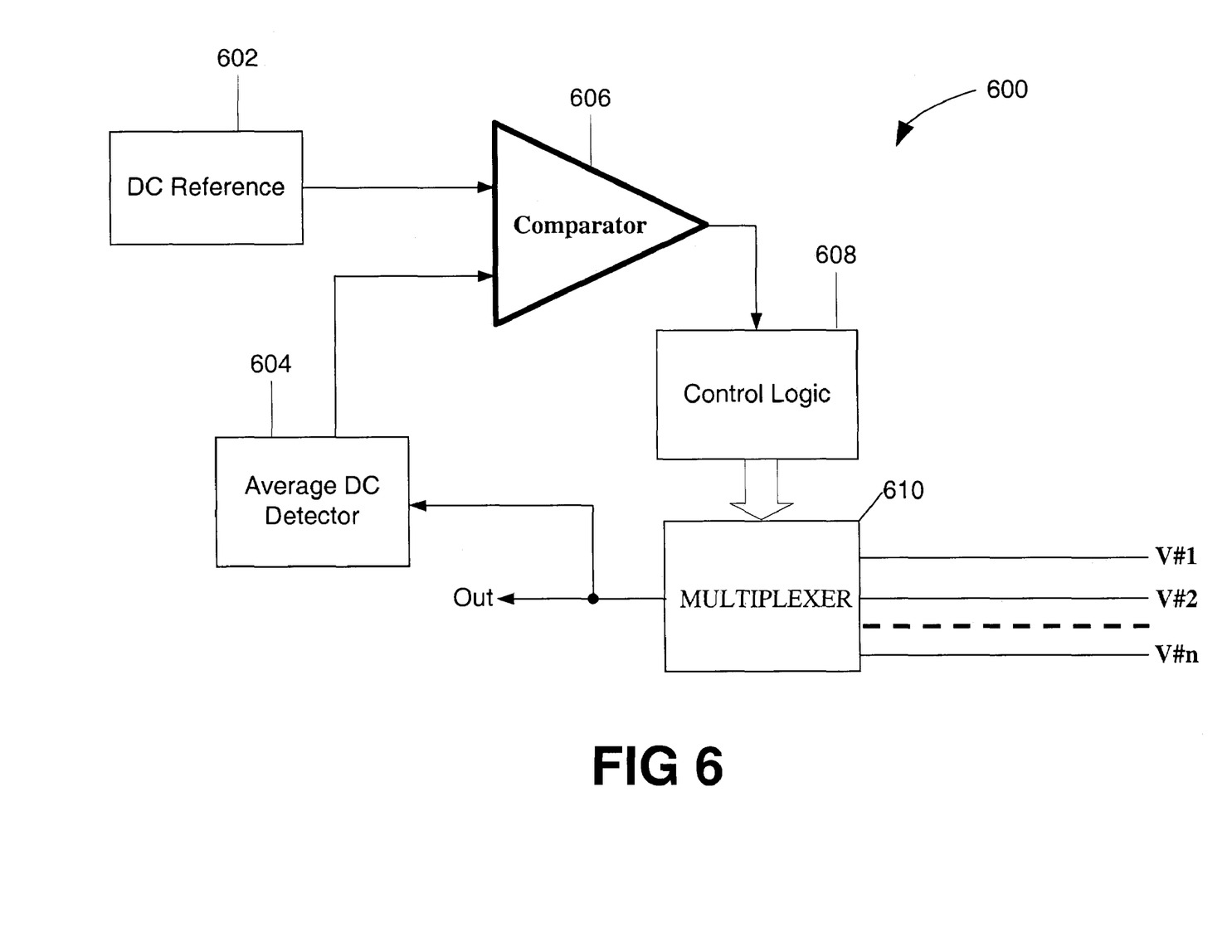
FIG. 6 is a block diagram representation of an apparatus according to some embodiments of the inventions.

FIG. 6 illustrates an apparatus 600 according to some embodiments. In some embodiments apparatus 600 may be referred to as a DC feedback loop. In some embodiments apparatus 600 may be referred to as a control circuit. In some embodiments the DC feedback loop 600 is used to adaptively equalize. In some embodiments the adaptive equalization may be used at a receiver to equalize frequency dependent loss over a transmission line or interconnect. In some embodiments apparatus 600 may be a feedback loop based on 8B/10B encoded signal characteristics of DC balance. In some embodiments apparatus 600 is used to select the output of a multiplexer and enable a required number of equalization stages based on a loss (for example, an interconnect loss).

Apparatus 600 includes a DC reference voltage value 602, an average DC voltage detector 604, a comparator 606, control logic 608 and a multiplexer 610. The multiplexer 610 may be the same multiplexer 416 as illustrated in FIG. 4 or a different multiplexer. Additionally, DC reference 602, average DC detector 604, comparator 606 and control logic 608 may be used in the some embodiments illustrated in FIG. 4 by plugging those elements in where the "control" input to multiplexer 416 is illustrated in FIG. 4. Similarly, the elements of the gain circuit and/or the apparatus 400 of FIG. 4 may be plugged in to the apparatus illustrated in FIG. 6. In some embodiments the gain circuit illustrated in FIG. 4 provides the discrete gain values V#1, V#2, . . . , V#n illustrated in FIG. 6.

Average DC detector 604 detects a DC voltage content of the output signal Out from multiplexer 610. Comparator 606 compares the detected DC content from average DC detector 604 with the DC reference value 602. In some embodiments DC reference 602, average DC detector 604 and comparator 606 figure out and compare the DC content of the output using a DC balance arrangement. Control logic 608 is used to select one of the discrete gain values V#1, V#2, . . . , V#n. Control logic 608 is programmed, for example, by providing more attenuation at high frequency and less attenuation at low frequency.

Figure 7:
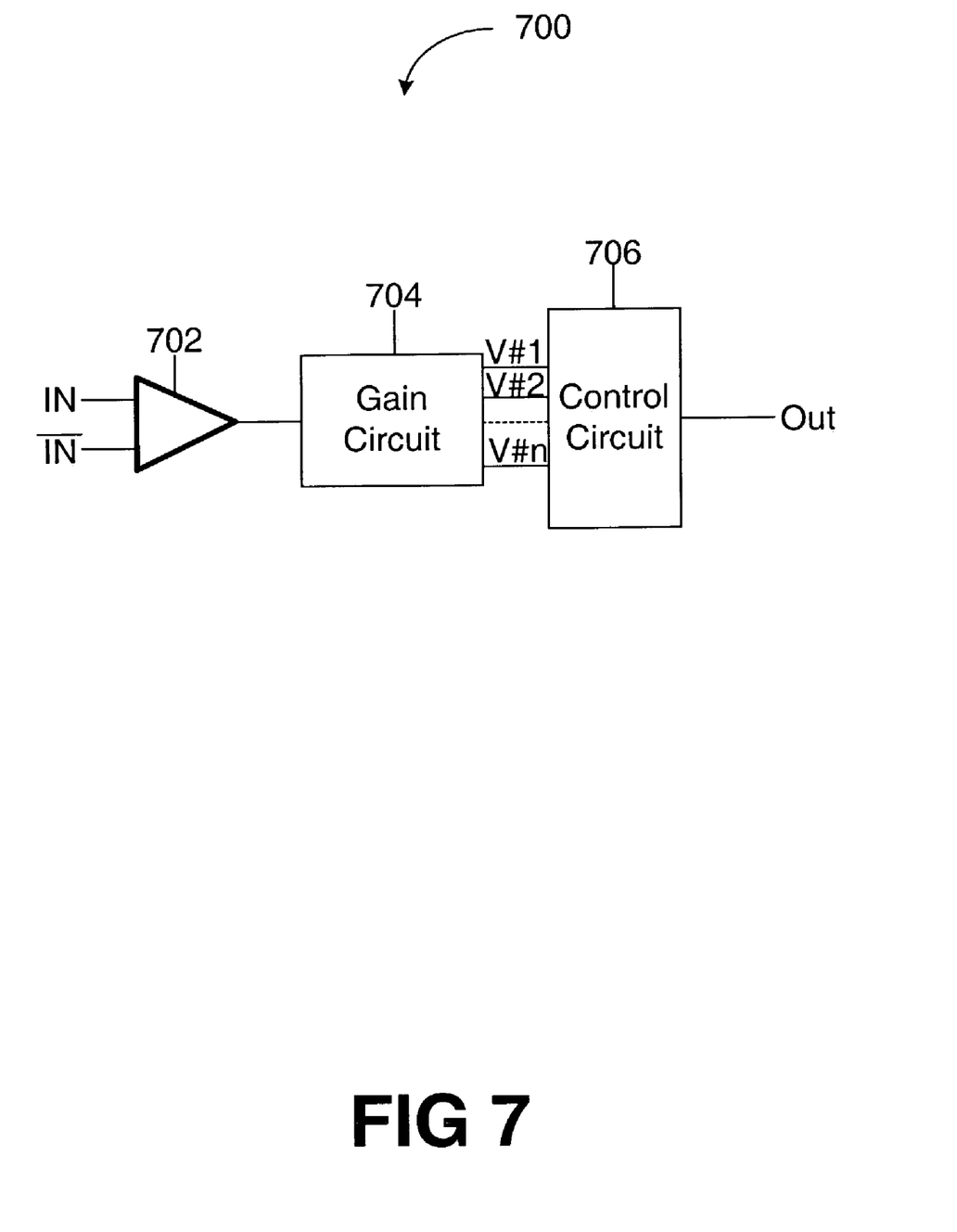
FIG. 7 is a block diagram representation of an apparatus according to some embodiments of the inventions.

FIG. 7 illustrates an apparatus 700 according to some embodiments. In some embodiments apparatus 700 is an equalization circuit. Apparatus 700 includes an amplifier 702, a gain circuit 704 and a control circuit 706.

Amplifier 702 has an input IN and an inverse input $\overline{IN}$ and an output. The output of the amplifier 702 is provided as an input to gain circuit 704. Gain circuit 704 provides two or more discrete gain values V#1, V#2, . . . , V#n. In some embodiments gain circuit 704 is the gain circuit illustrated in FIG. 4 that provides discrete gain values V#1, V#2 . . . , V#n. Discrete gain values V#1, V#2, . . . , V#n illustrated in FIG. 7 can be the same as or different than discrete gain values V#1, V#2, . . . , V#n illustrated in FIG. 4. Control circuit 706 receives the two or more discrete gain values V#1, V#2, . . . , V#n and provides an output Out in response to the discrete gain values. In some embodiments control circuit 706 selects one of the discrete gain values V#1, V#2, . . . , V#n as the output Out. In some embodiments control circuit 706 is implemented using the apparatus 600 illustrated in FIG. 6 (for example, control circuit or feedback loop, etc.). In some embodiments gain circuit 704 and control circuit 706 adaptively equalize the output from amplifier 702.

Figure 8:
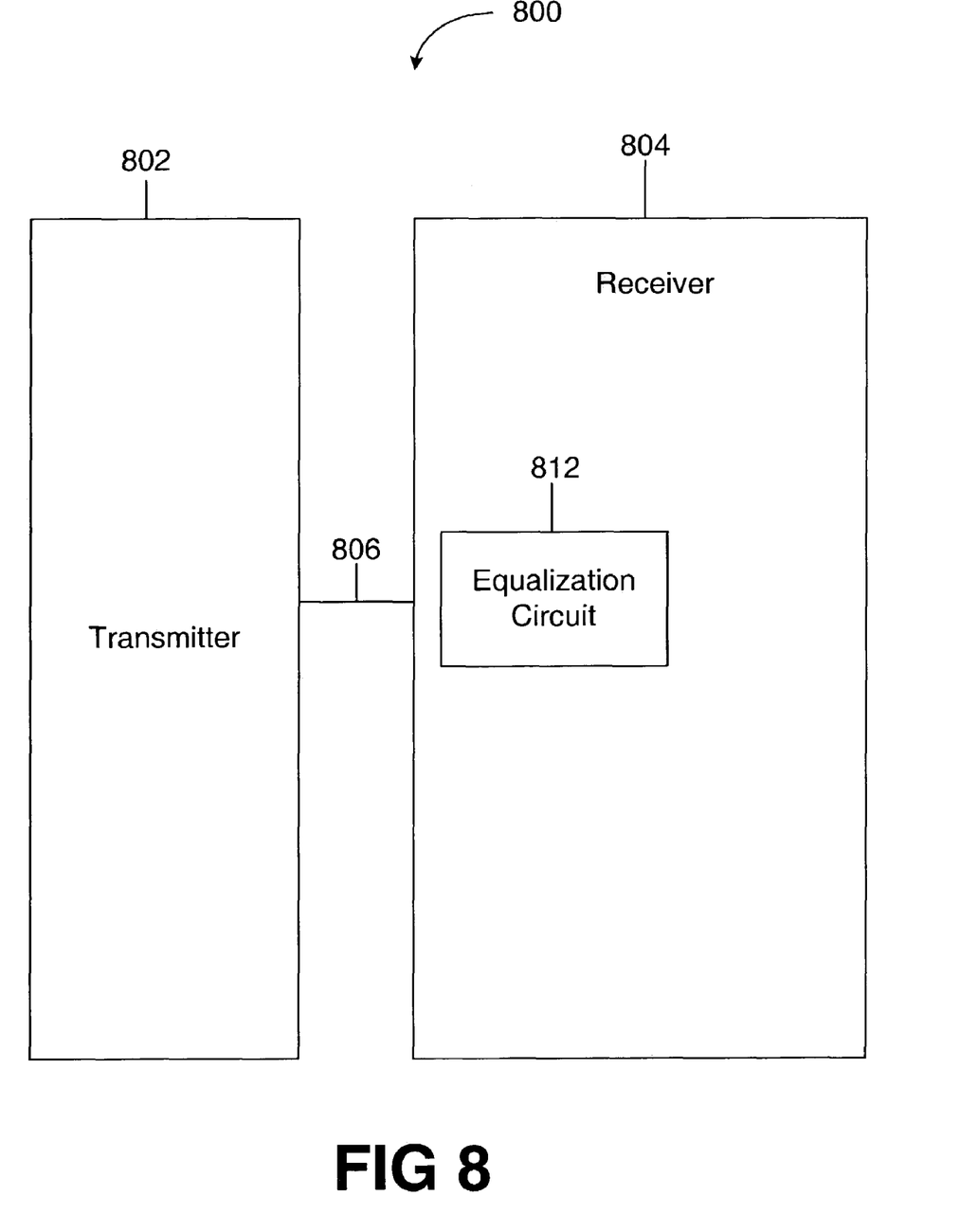
FIG. 8 is a block diagram representation of a system according to some embodiments of the inventions.

FIG. 8 illustrates a system 800 according to some embodiments. System 800 includes a transmitter 802, a receiver 804 and a transmission line (or interconnect) 806. Receiver 804 includes an equalization circuit 812. In some embodiments equalization circuit 812 adaptively equalizes a loss in a signal. The equalization may necessary, for example, due to a loss on the transmission line (or interconnect) 806, or some other loss. In some embodiments equalization circuit 812 is an equalization circuit similar to or the same as equalization circuit 700 illustrated in FIG. 7.

In some embodiments illustrated and described herein a single ended signaling scheme is used. However, some embodiments are implemented in a scheme using differential signals. In some embodiments equalization is performed in chip-to-chip communication using high speed serial point-to-point interconnects.

In each system shown in a figure, the elements in some cases may each have a same reference number or a different reference number to suggest that the elements represented could be different and/or similar. However, an element be flexible enough to have different implementations and work with some or all of the systems shown or described herein. The various elements shown in the figures may be the same or different. Which one is referred to as a first element and which is called a second element is arbitrary.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams may have been used herein to describe embodiments, the inventions are not limited to those diagrams or to corresponding descriptions herein. For example, flow need not move through each illustrated box or exactly in the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
   a CMOS amplifier;
   a CMOS gain circuit coupled to an output of the CMOS amplifier, the CMOS gain circuit to provide at least two gain values in response to the output of the CMOS amplifier; and
   a control circuit to provide one of the at least two gain values as an output;
   wherein the CMOS gain circuit includes at least two equalization circuits each providing a respective one of the at least two gain values.

2. The apparatus as claimed in claim 1, wherein the at least two equalization circuits are coupled in series to the output of the CMOS amplifier.

3. The apparatus as claimed in claim 1, wherein each of the at least two equalization circuits includes an RC filter.

4. The apparatus as claimed in claim 3, wherein a resistance R and a capacitance C of the RC filter are implemented using on-chip components.

5. The apparatus as claimed in claim 3, wherein a resistance R of the RC filter is implemented using passive components.

6. The apparatus as claimed in claim 3, wherein a resistance R of the RC filter is implemented using active components.

7. The apparatus as claimed in claim 3, wherein all resistors in the apparatus are formed of a same technology.

8. The apparatus as claimed in claim 7, wherein the same technology is a poly resistance technology.

9. The apparatus as claimed in claim 3, wherein R and C values of the RC filter are fixed during a circuit design phase.

10. The apparatus as claimed in claim 1, wherein the control circuit includes a DC feedback circuit and the output provided by the control circuit is selected in response to the DC feedback circuit.

11. The apparatus as claimed in claim 10, wherein the DC feedback circuit uses DC balance to help select the output.

12. The apparatus of claim 1, wherein the apparatus comprises an equalizer to equalize inter-symbol interference generated by frequency dependent loss characteristics of printed circuit board traces.

13. The apparatus of claim 1, wherein the apparatus comprises an equalizer to equalize inter-symbol interference generated by frequency dependent loss characteristics of high speed point-to-point interconnects between two integrated circuits.

14. A system comprising:
    a transmitter;
    a receiver; and
    an interconnect coupled to the transmitter and the receiver;
    wherein the receiver includes an equalization circuit comprising:
      a CMOS amplifier;
      a CMOS gain circuit coupled to an output of the CMOS amplifier, the CMOS gain circuit to provide at least two gain values in response to the output of the CMOS amplifier; and
      a control circuit to provide one of the at least two gain values as an output;
      wherein the CMOS gain circuit includes at least two equalization circuits each providing a respective one of the at least two gain values.

15. The system as claimed in claim 14, wherein the at least two equalization circuits are coupled in series to the output of the CMOS amplifier.

16. The system as claimed in claim 14, wherein each of the at least two equalization circuits includes an RC filter.

17. The system as claimed in claim 14, wherein the control circuit includes a DC feedback circuit and the output provided by the control circuit is selected in response to the DC feedback circuit.

18. The system as claimed in claim 17, wherein the DC feedback circuit uses DC balance to help select the output.

19. The system of claim 14, wherein the transmitter and the receiver are each integrated circuits on a printed circuit board and the interconnect is a high speed interconnect on the printed circuit board, wherein the equalization circuit is to equalize inter-symbol interference generated by frequency dependent loss characteristics of printed circuit board traces.

20. The system of claim 14, wherein the transmitter and the receiver are each integrated circuits on a printed circuit board and the interconnect is a high speed interconnect on the printed circuit board, wherein the equalization circuit is to equalize inter-symbol interference generated by frequency dependent loss characteristics of the high speed point-to-point interconnect.

* * * * *